(12) United States Patent
Plazonic et al.

(10) Patent No.: US 8,899,246 B2
(45) Date of Patent: Dec. 2, 2014

(54) DEVICE AND METHOD FOR PROCESSING WAFER SHAPED ARTICLES

(75) Inventors: Ante Plazonic, Feistritz/Drau (AT); Christian Aufegger, Weisenstein (AT); Reinhold Schwarzenbacher, Kolbnitz (AT)

(73) Assignee: Lam Research AG, Villach (AT)

( * ) Notice: Subject to any disclaimer, the term of this patent is extended or adjusted under 35 U.S.C. 154(b) by 402 days.

(21) Appl. No.: 13/303,518

(22) Filed: Nov. 23, 2011

(65) Prior Publication Data

US 2013/0125379 A1 May 23, 2013

(51) Int. Cl.
*B08B 3/04* (2006.01)
*H01L 21/67* (2006.01)

(52) U.S. Cl.
CPC ...... *H01L 21/67051* (2013.01); *H01L 21/6708* (2013.01)
USPC ........... 134/104.2; 29/243; 134/137; 134/149

(58) Field of Classification Search
USPC ............. 29/559, 243; 134/104.2, 104.4, 94.1, 134/104.3, 109, 111, 137, 149, 151, 155, 134/133; 279/157
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 5,916,366 A | 6/1999 | Ueyama et al. | |
| 6,810,888 B2 | 11/2004 | Tsuchiya et al. | |
| 7,958,898 B2 | 6/2011 | Yoshida | |
| 2004/0103931 A1 | 6/2004 | Tsuchiya et al. | |
| 2007/0022948 A1 | 2/2007 | Rose et al. | |
| 2007/0272357 A1 | 11/2007 | Endo et al. | |

FOREIGN PATENT DOCUMENTS

| | | |
|---|---|---|
| JP | 2004-265910 A | 9/2004 |
| WO | 2004/070807 A1 | 8/2004 |

OTHER PUBLICATIONS

International Search Report, dated Apr. 5, 2013, from corresponding PCT application.

*Primary Examiner* — Ryan J Walters
(74) *Attorney, Agent, or Firm* — Young & Thompson

(57) ABSTRACT

A device for processing wafer-shaped articles, comprises a chuck adapted to receive a wafer shaped article, and a collector surrounding the chuck. The collector comprises a base and a plurality of divider walls, as well as a plurality of nested partitions surrounding the chuck. Each of the plurality of nested partitions is positioned on a corresponding one of the plurality of divider walls, and each of the plurality of nested partitions is vertically movable so as to define a plurality of separate process regions within the collector depending on the vertical position of each of the plurality of nested partitions. At least one of the divider walls comprises an internal exhaust conduit communicating with an exhaust duct underlying the divider wall.

14 Claims, 4 Drawing Sheets

DEVICE AND METHOD FOR PROCESSING WAFER SHAPED ARTICLES

BACKGROUND OF THE INVENTION

The invention relates to methods and devices for processing wafer-shaped articles, such as semiconductor wafers.

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668. Such chucks are typically provided with a surrounding collector to handle the liquids discharged during processing, as well as to vent the gases used during processing.

In order that a wafer may undergo multiple process steps while positioned on a same chuck, collectors have been designed that permit the wafer to be positioned at each of plural process levels, as described for example in U.S. Pat. No. 4,903,717. Collectors have also been designed in which a series of vertically movable partitions are arranged concentrically around the chuck, as described for example in U.S. Pat. No. 6,810,888 and Japanese Patent Publication No. 2004-265910, so as to define separate liquid collection regions depending on the position of the partitions.

In the latter category of processing apparatus, however, there remains a need for equipment that can adequately handle both the liquid discharge and the gaseous exhaust separately for each process stage, in a device that is practical for use in a commercial production environment.

SUMMARY OF THE INVENTION

The present invention in one aspect relates to a device for processing wafer-shaped articles, comprising a chuck adapted to receive a wafer shaped article, and a collector surrounding the chuck. The collector comprises a base and a plurality of divider walls, as well as a plurality of nested partitions surrounding the chuck. The collector further comprises a plurality of liquid drainage channels communicating with liquid drainage conduits mounted exteriorly of the collector. Each of the plurality of nested partitions is positioned on a corresponding one of the plurality of divider walls, and each of the plurality of nested partitions is vertically movable so as to define a plurality of separate process regions within the collector depending on the vertical position of each of the plurality of nested partitions. At least one of the divider walls comprises an internal exhaust conduit communicating with an exhaust duct underlying the divider wall.

In preferred embodiments of the device according the present invention, the chuck is mounted on a rotary shaft and comprises a series of upwardly projecting pins configured to confine a wafer-shaped article on the chuck.

In preferred embodiments of the device according the present invention, the chuck is a magnetic rotor positioned within a housing and surrounded by a magnetic stator positioned outside the housing, the magnetic rotor comprising a series of downwardly projecting pins configured to confine a wafer-shaped article on the chuck.

In preferred embodiments of the device according the present invention, surfaces of the pins configured to contact a wafer shaped article are spaced above the plurality of nested partitions when each of the plurality of nested partitions is in a vertically lowermost position, thereby to permit loading and unloading of a wafer shaped article onto and from the chuck.

In preferred embodiments of the device according the present invention, the chuck is fixedly mounted relative to the collector against movement along an axis of rotation of the chuck.

In preferred embodiments of the device according the present invention, the plurality of nested partitions is a plurality of annular concentric partitions.

In preferred embodiments of the device according the present invention, the plurality of nested partitions is a plurality of annular concentric partitions.

In preferred embodiments of the device according the present invention, each of the plurality of nested partitions comprises a base portion including an inner flange disposed adjacent a radially inner side of a corresponding one of the plurality of divider walls, and an outer flange disposed adjacent a radially outer side of the corresponding one of the plurality of divider walls.

In preferred embodiments of the device according the present invention, the internal exhaust conduit opens on a lateral surface of the at least one of the divider walls.

In preferred embodiments of the device according the present invention, the internal exhaust conduit opens on a radially inwardly facing surface of the at least one of the divider walls.

In preferred embodiments of the device according the present invention, the internal exhaust conduit opens on a radially outwardly facing surface of the at least one of the divider walls.

In preferred embodiments of the device according the present invention, the internal exhaust conduit is covered by one of the plurality of divider walls in a vertically lowermost position of the one of the plurality of divider walls, and uncovered by the one of the plurality of divider walls in a vertically uppermost position of the one of the plurality of divider walls.

In preferred embodiments of the device according the present invention, the internal exhaust conduit is exposed through a window formed in one of the plurality of divider walls in a vertically lowermost position of the one of the plurality of divider walls, and covered by the one of the plurality of divider walls in a vertically uppermost position of the one of the plurality of divider walls.

In preferred embodiments of the device according the present invention, the liquid drainage channels and the liquid drainage conduits are fixedly mounted relative to the collector.

In preferred embodiments of the device according the present invention, the plurality of divider walls comprises at least three divider walls, and wherein the plurality of nested partitions comprises at least three divider walls each positioned on a corresponding one of the at least three divider walls, and wherein at least two of the at least three divider walls comprises an internal exhaust conduit communicating with a corresponding exhaust duct underlying a corresponding one of the at least three divider walls.

The present invention in another aspect relates to a method for processing wafer-shaped articles, comprising:

positioning a wafer shaped article on a chuck;

changing a vertical position of at least one of a plurality of nested partitions surrounding the chuck, each of the plurality of nested partitions being positioned on a corresponding one of a plurality of divider walls formed in a base of a collector that surrounds the chuck;

rotating the chuck and the wafer shaped article; and venting exhaust gases from the collector through an internal exhaust conduit formed in at least one of the plurality of divider walls, and into an exhaust duct underlying the at least one divider wall.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
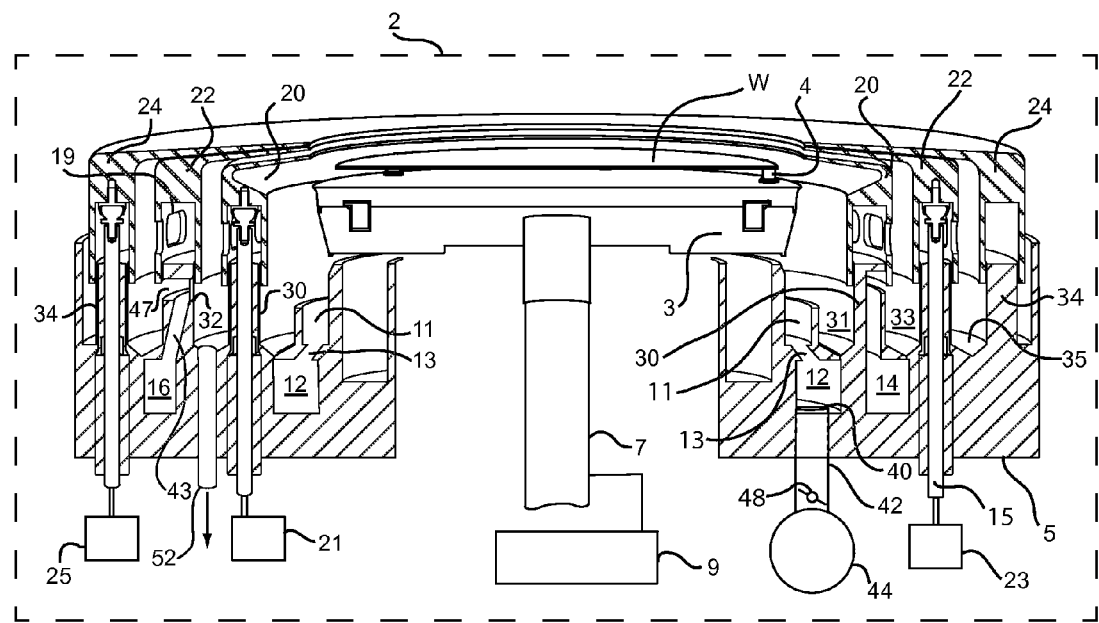
FIG. 1 is a schematic cross-sectional view of a device for treating wafer shaped articles according to various embodiments of the present invention.

In FIG. 1, a chuck 3 has a wafer W held in a processing position by pins 4. Chuck 3 may include dispensing nozzles (not shown) for gas and process liquid, and these nozzles may be positioned above and/or below the wafer W. Chuck 3 may support the wafer W from below solely by a flow of gas, with pins 4 retaining the wafer W laterally and/or from above; alternatively, pins 4 may be configured so as to grip and support the chuck, so that process liquid and gas may be more readily supplied to the underside of wafer W.

Chuck 3 is housed in a surrounding enclosure designated schematically at 2, and such enclosure may be a process module for single wafer wet processing of semiconductor wafers. In that case, wafer W will normally be of a standard diameter, such as 200 mm, 300 mm or 450 mm.

Chuck 3 in this embodiment is a spin chuck driven by motor 9 via the rotary shaft 7. Shaft 7 is thus journalled for rotation in the surrounding collector 5. The chuck 3 may or may not also be movable axially within the collector 5, via shaft 7. However, for some applications it can be advantageous to have the chuck 3 mounted such that it is not axially displaceable relative to the collector 5, as will be explained in detail hereinafter, and this is the case for the depicted embodiment.

Collector 5 comprises a base having formed therein a set of nested dividers 30, 32, 34. In this embodiment, the dividers 30, 32, 34 are annular and concentric, which is preferred. The term "nested" is intended to encompass not only a concentric arrangement of annular dividers, but also other interfitted arrangements of non-annular dividers, e.g., of square or polygonal dividers. In the present embodiment there are three dividers 30, 32, 34, but the number of dividers can be as few as two and as many as five.

The collector 5 also includes three partitions 20, 22, 24, each positioned on a respective divider 30, 32, 34. The partitions 20, 22, 24 are each vertically moveable, i.e., movable in a direction parallel to the axis of rotation of the chuck 3. The partitions are moved by jacks 15, which in turn are actuated by a suitable arrangement of motors 21, 23, 25, which may be for example pneumatic motors, and interconnecting linkages, as depicted schematically in FIG. 1. Only one jack 15 is shown in FIG. 1 for each partition, but in practice it is preferred to provide three jacks for each partition, at intervals of 120° about the partitions, to lift the partitions more evenly. In that case the jacks for a given position are preferably linked in common to the actuating motor 21, 23, 25 by a plate or the like.

The collector 5 also includes a series of liquid drainage channels 31, 33, 35 formed in the base of collector 5 between adjacent dividers 30, 32, 34. Each drainage channel 31, 33, 35 preferably extends in a full circle about the periphery of the chuck 3, as do dividers 30, 32, 34 and partitions 20, 22, 24. Each drainage channel 31, 33, 35 comprises one or more liquid discharge outlets, one of which is shown on the left-hand side of channel 33 in FIG. 1, and which communicates with a liquid discharge conduit 52. The liquid discharge conduit 52 is connected to the middle drainage channel 33. The other two liquid drainage channels 31, 35 include similar liquid discharge outlets and conduits, which are not depicted in the drawings for ease of reference.

The structure of the collector 5 of this embodiment permits the liquid drainage channels and their associated outlets and conduits to be stationary relative to the collector 5. That is a significant advantage relative to prior art such as U.S. Pat. No. 6,810,888, because the elimination of components that slide axially relative to one another reduces the likelihood of particle generation within the process module. As is known by those skilled in the art, semiconductor wafer processing requires an ultra clean environment, and even very low incidence of particulate matter in the process module can significantly reduce the yield of satisfactory product.

Each partition 20, 22, 24 has a base constituted by a pair of concentric annular flanges, with one flange being adjacent the radially inner face of a corresponding divider 30, 32, 34, and the other flange being adjacent the radially outer face of that corresponding divider. Thus, each partition 20, 22, 24 straddles a corresponding one of the dividers 30, 32, 34, such that the dividers 30, 32, 34 guide the vertical movement of the partitions 20, 22, 24.

The jacks 15 slide within bores provided in the dividers 30, 32, 34; however, because the rods of jacks 15 emerge from the dividers 30, 32, 34 at the upper ends thereof, where they are at all times covered by the partitions 20, 22, 24, the potential for particulate contamination from that source is significantly reduced relative to prior art such as Japanese Patent Publication No. 2004-265910.

Dividers 30, 32, 34 according to the present embodiment not only guide the partitions in their vertical movement, and define the adjacent liquid drainage channels 31, 33, 35, but one or more of them may also include internal conduits for removing exhaust gases from the interior of collector 5. In particular, dividers 30 and 32 in this embodiment comprise internal conduits 41 and 43, respectively (see also FIGS. 2 and 3). Those conduits 41, 43 are separate from one another, and lead to corresponding separate exhaust ducts 14, 16 that underlie respective drainage channels 31, 33. An inner exhaust duct 12 is also provided in this embodiment, the channel 11 and conduit 13 of which are not a part of any of the dividers 30, 32, 34.

Each exhaust duct 12, 14, 16 comprises one or more openings 40, which leads through outlets 42 to a respective separate exhaust pipe 44. One or more valves, for example a butterfly valve 48 as shown in FIG. 1, is preferably provided in the exhaust outlet 42 and/or in the exhaust pipe 44, to prevent backflow of exhaust gas or drainage liquid when the process area in question is not in use. Such valves, like motors 9, 21, 23 and 25, are under the common control of a microprocessor programmed to implement the desired process sequence.

Figure 2:
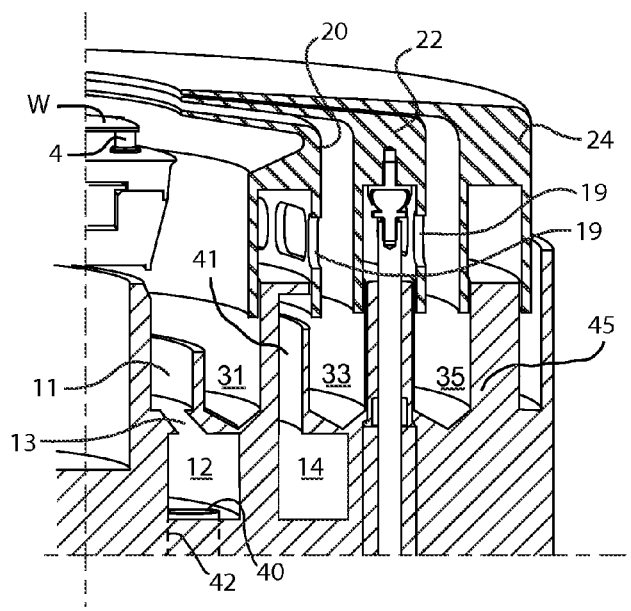
FIG. 2 is a detail of the device depicted in FIG. 1, showing the set of partitions in a first configuration.

In FIGS. 1 and 2, opening 40, outlet 42, pipe 44 and valve 48 are depicted in communication with duct 12. Channels 14 and 16 include similar openings, outlets, pipes and valves, which are not depicted in the drawings, for ease of reference. The exhaust is actively pulled from the collector through these pipes, either by a common exhaust handler or by separate dedicated exhaust handlers. In either event, the segregation of the exhaust gas flows within the process module prevents cross-contamination within the collector and thus provides a significant improvement over prior art devices.

FIG. 2 shows on a larger scale a first configuration of the partitions 20, 22, 24, which is the configuration wherein the partitions are all in their vertically uppermost position. When the jacks for each partition are interconnected via a plate linkage, the plates may conveniently be superposed such that the innermost partition 20 is associated with the lowermost linkage plate, the middle partition 22 with the intermediate linkage plate, and the outermost partition 24 with the uppermost linkage plate. Such an arrangement permits the partitions 20, 22, 24 to be raised and lowered conjointly or individually, although the individual raising and lowering would in that case be limited to a unidirectional sequence.

Thus, with the partitions 20, 22, 24 all raised as shown in FIG. 2, the active process region of the collector is the volume that is delimited by the radially inwardly facing surface of partition 20. Thus, process liquid flung from the wafer W is diverted by that surface into the associated liquid drainage channel 31, whereas exhaust gas is drawn through channel 11 into conduit 13 and then into duct 12 and out through opening 40, outlet 42, and pipe 44.

With reference to FIG. 1, it will be noted that the opening 47 to conduit 43 is exposed by partition 22 in this configuration of the partitions 20, 22, 24. However, provision of one or more valves as described above in connection with element 48 prevents the suction applied to exhaust duct 12 of the active process region from creating a backflow of exhaust through conduit 16 in this inactive process region.

If desired, computer-controlled butterfly valves may also be provided in each of the liquid discharge conduits such as that illustrated at 52, so that any vacuum generated in an inactive process region by the exhaust of the active process region, cannot lead to discharge liquid being drawn backward into its respective channel.

It will be appreciated that these backflow prevention measures mean that the partitions need not form a gas-tight seal against one another, which improves the practicality of the devices according to the present invention from the standpoint of making as well as using the same.

Figure 3:
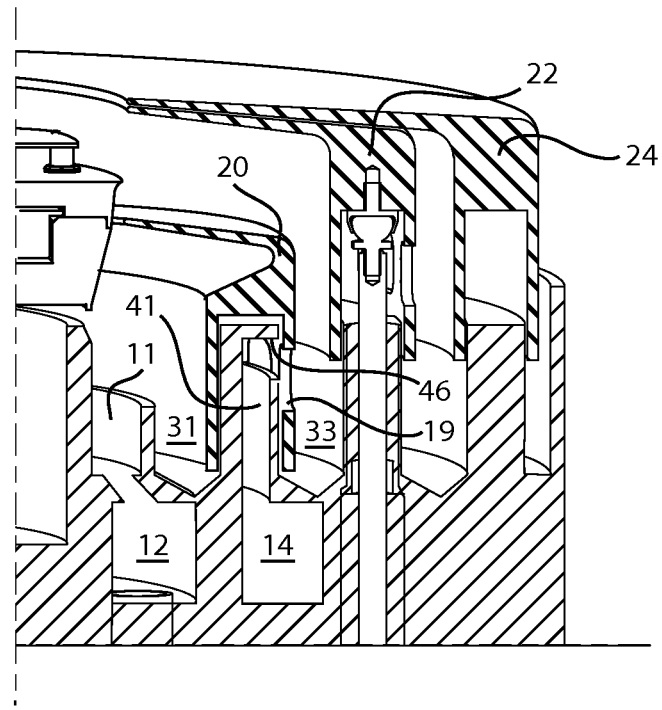
FIG. 3 is a detail of the device depicted in FIG. 1, showing the set of partitions in a second configuration.

A second configuration of the partitions 20, 22, 24 is depicted in FIG. 3. In the FIG. 3 configuration, partitions 22 and 24 remain in their uppermost vertical position, whereas partition 20 has been lowered to its lowermost vertical position. In this configuration, the active process region of collector 5 is the annular volume defined by the outer surfaces of partition 20 and the inner surfaces of partition 22. Partition 20 in this configuration moreover serves as a barrier or baffle that deflects both process liquid and exhaust gas away from the liquid drainage channel 31 and the exhaust channel 11 discussed in connection with FIG. 2.

Instead, in the FIG. 3 configuration, process liquid is directed into liquid drainage channel 33, from whence it passes through discharge outlets and conduits as described previously. Exhaust gases are drawn through the internal conduit 41 that is formed in divider 30. Conduit 41 terminates upstream in an opening 46 that opens in this embodiment on the radially outward side surface of divider 30. Opening 46 in this embodiment overlaps with a window 19 formed in partition 20, so that gas can pass into conduit 41.

Alternatively, the conduit for the process region shown in FIG. 3 could be formed in the divider 32, in which case its conduit would open in the radially inward side surface of divider 32. In that case partition 22 would not include a window 19, but rather the solid inner flange of partition 22 would uncover the conduit opening when partition 22 is in the raised position depicted in FIG. 3.

After exhaust gas is drawn into conduit 41, it then passes into duct 14 and thence out through an opening, outlet and pipe that are not shown, but are like those shown at 40, 42, 44.

Figure 4:
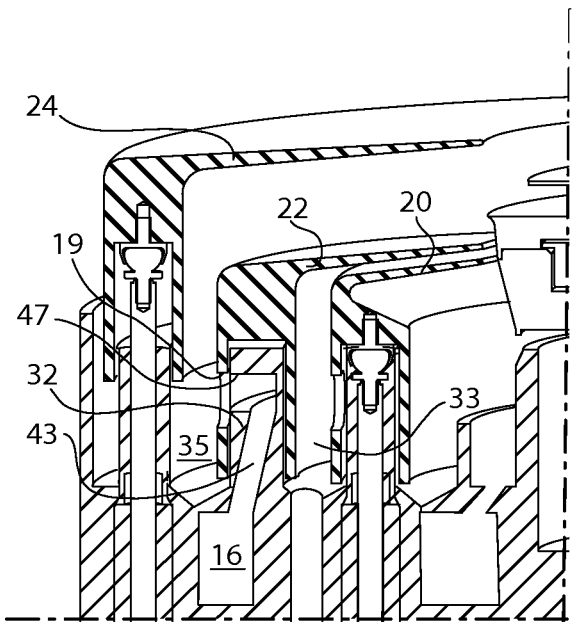
FIG. 4 is a detail of the device depicted in FIG. 1, showing the set of partitions in a third configuration.

A third configuration of the partitions 20, 22, 24 is depicted in FIG. 4. In the FIG. 4 configuration, only partition 24 remains in its uppermost vertical position, whereas partitions 20 and 22 have both been lowered to their lowermost vertical position. In this configuration, the active process region of collector 5 is the annular volume defined by the outer surfaces of partition 22 and the inner surfaces of partition 24. Partition 22 in this configuration moreover serves as a barrier or baffle that deflects both process liquid and exhaust gas away from the liquid drainage channel 33 and the exhaust conduit 41 discussed in connection with FIG. 3.

Instead, in the FIG. 4 configuration, process liquid is directed into liquid drainage channel 35, from whence it passes through discharge outlets and conduits as described previously. Exhaust gases are drawn through the internal conduit 43 that is formed in divider 32. Conduit 43 terminates upstream in an opening 47 that opens in this embodiment on the radially outward side surface of divider 32. Opening 47 in this embodiment is exposed through the window 19 of partition 22 when partition 22 is in the lowered position depicted in FIG. 4.

If desired, a further conduit for the process region shown in FIG. 4 may be formed in the divider 34, which as depicted has no exhaust conduit. Such a conduit would open on the radially inward side surface of divider 34. Partition 24 would in that case expose the exhaust opening in the divider 34 when partition 24 is in the raised position depicted in FIG. 4.

After exhaust gas is drawn into conduit 43, it then passes into duct 16 and thence out through a corresponding opening, outlet and pipe that are not shown, but are like those shown at 40, 42, 44.

Figure 5:
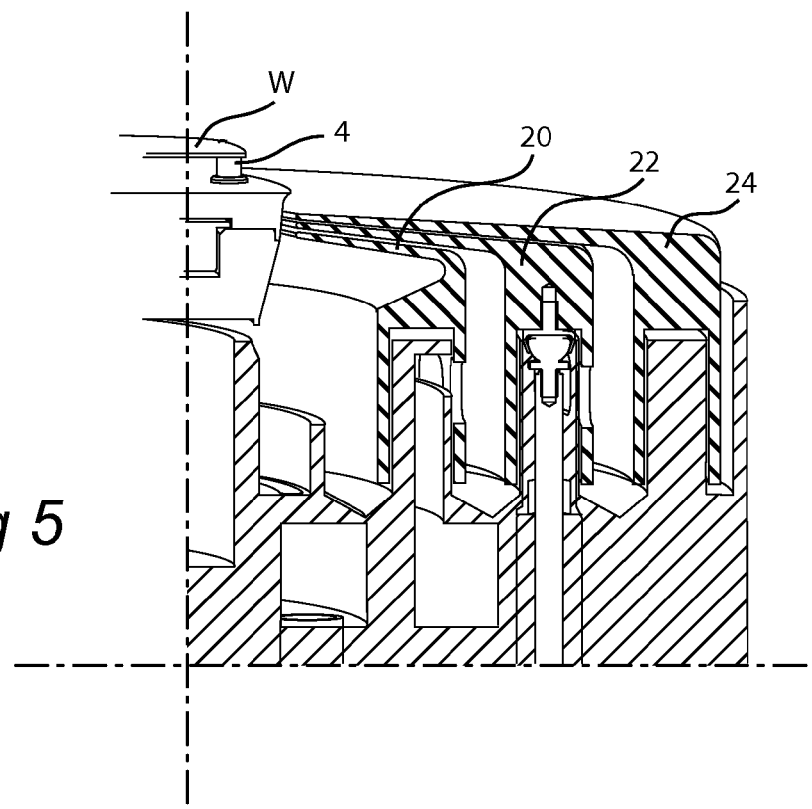
FIG. 5 is a detail of the device depicted in FIG. 1, showing the set of partitions in a fourth configuration.

A fourth configuration of the partitions 20, 22, 24 is depicted in FIG. 5. In the FIG. 5 configuration, all of the partitions 20, 22, 24 have been lowered to their lowermost vertical position. This is the loading and unloading position of the partitions 20, 22, 24, that is, the configuration in which a wafer W can most easily be loaded onto and unloaded from the chuck 3. It will be noted that, in this configuration, the uppermost surfaces of partitions 20, 22, 24 are all positioned at a lower level than the wafer contacting surfaces of the chuck pins 4. As no other surface of the collector is at the level of the wafer contacting surfaces of the chuck pins 4 in the FIG. 5 configuration, unloading and loading of wafers W is facilitated. Loading and unloading through a side door in the enclosure 2 may be effected due to this construction.

It will be appreciated from the foregoing description that the outer divider 34 as depicted does not include an internal exhaust conduit, although optional provision of such a conduit is contemplated if it is desired to provide an increased exhaust flow for the process region depicted in FIG. 4.

It will also be appreciated from the foregoing description that the exhaust handling made possible by the described collector structure permits the exhaust conditions within each process region to be individually controlled, e.g., by varying the suction force applied to the respective ducts 12, 14, 16. That capability of the disclosed embodiments permits not only prevention of gaseous cross-contamination, but also finer process control and improved production yield.

Figure 6:
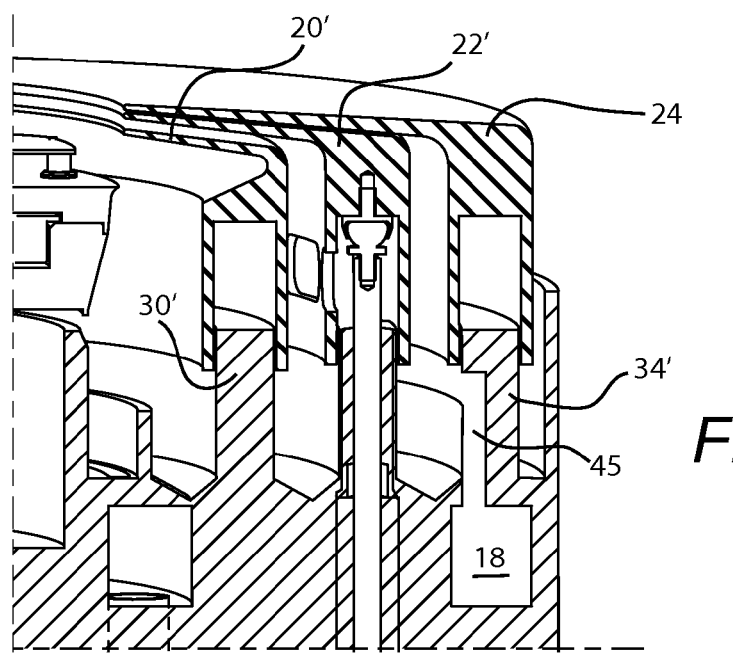
FIG. 6 is a detail of an alternative embodiment of the device of FIG. 1, showing the partitions in the configuration corresponding to that of FIG. 2.

FIG. 6 depicts an alternative construction for the collector 5, with partitions 20', 22', 24 in the configuration corresponding to that of FIG. 2. In this alternative construction, the inner divider 30' no longer includes an exhaust conduit, whereas the outer divider 34' now does include an exhaust conduit 45, which communicates with an exhaust duct 18.

Figure 7:
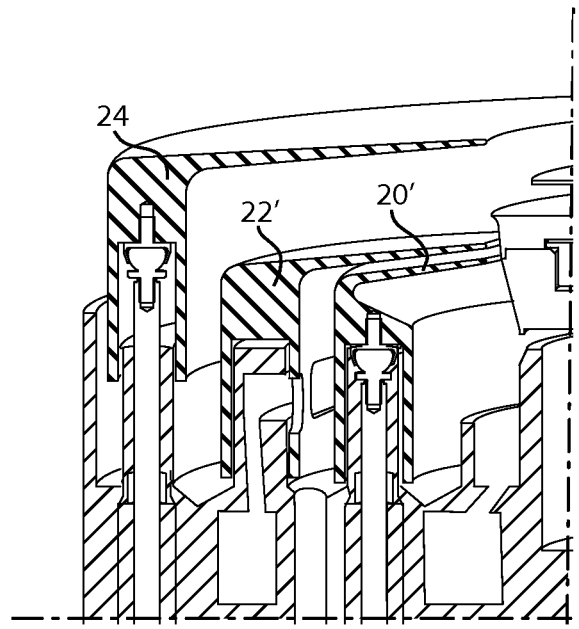
FIG. 7 is a detail of the alternative embodiment of FIG. 6, showing the partitions in the configuration corresponding to that of FIG. 4.

Thus, with reference to FIG. 7, when the partitions of this alternative collector structure are set to the configuration corresponding to that of FIG. 4, the active process area will be defined between the outer surfaces of partition 22' and the inner surfaces of partition 24, and the exhaust stream will flow thought the conduit 45 formed in outer divider 34', the opening of which conduit is exposed when partition 24 is in its raised position.

Figure 8:
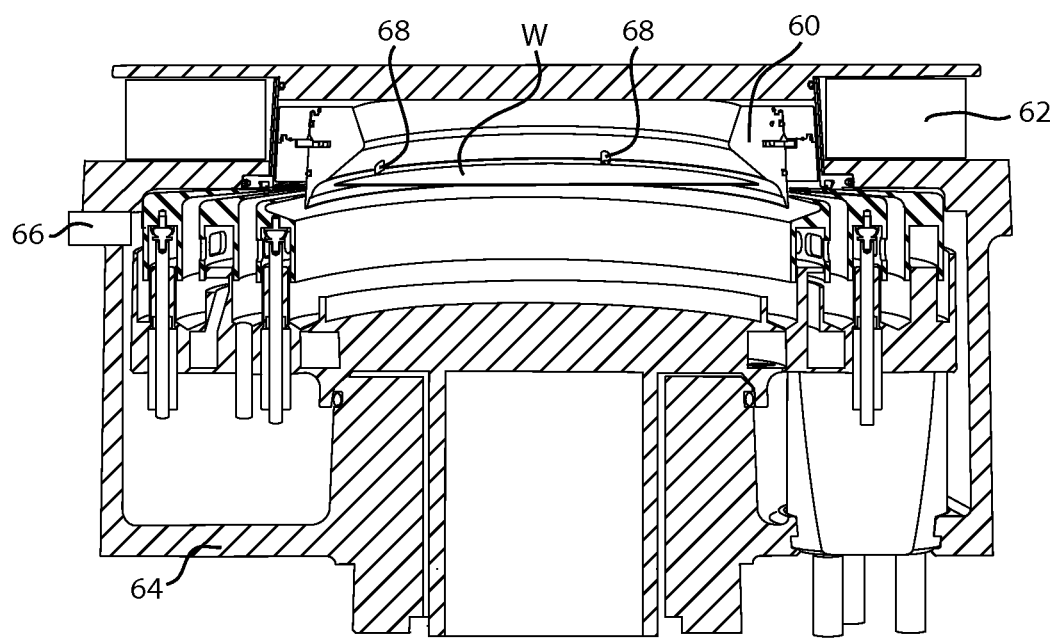
FIG. 8 is a schematic cross-sectional view of a device for treating wafer shaped articles according to other various embodiments of the present invention.

FIG. 8 depicts a collector structure similar to that of FIG. 1 applied to a different type of chuck, namely a chuck in which the wafer W is held by a magnetic rotor 60. Both the chuck 60 and the collector are contained with a chamber 64. A stator 62 is positioned outside of the chamber 64 and adjacent the magnetic rotor 60. Control of current supplied to the stator 62 in turn controls the rotation of magnetic rotor 60. Wafer W in this embodiment hangs from the underside of the magnetic rotor 60, and is held in position by a circular series of downwardly-depending pins 68 mounted within the magnetic rotor 60. The chamber 64 may be provided with a side door 66 to permit loading and unloading of wafers W from the chuck 60, when the partitions of the collector are in their lower vertical position as depicted in FIG. 5.

As discussed in greater detail above, the operation of the devices described in the foregoing embodiments may involve positioning a wafer shaped article on a chuck, and then changing a vertical position of at least one of the collector partitions so as to define a desired process region in the collector. The chuck is then rotated, and hence with it the wafer shaped article. During processing of the wafer shaped article, exhaust gases are vented from the collector through an internal exhaust conduit formed in at least one of the divider walls, and into an exhaust duct underlying the at least one divider wall.

As the devices according to certain embodiments of the present invention permit the exhaust conditions for each process region to be individually varied, the operation of the devices may if desired establish different gas flow rates for different process regions within the collector.

The invention claimed is:

1. A device for processing wafer-shaped articles, comprising:
    a chuck adapted to receive a wafer shaped article;
    a collector surrounding said chuck, said collector comprising a base and a plurality of divider walls;
    said collector further comprising a plurality of liquid drainage channels communicating with liquid drainage conduits mounted exteriorly of said collector;
    said collector further comprising a plurality of nested partitions surrounding said chuck, each of said plurality of nested partitions being positioned on a corresponding one of said plurality of divider walls, and each of said plurality of nested partitions being vertically movable so as to define a plurality of separate process regions within said collector depending on a vertical position of each of said plurality of nested partitions;
    wherein at least one of said divider walls comprises an internal exhaust conduit communicating with an exhaust duct underlying said divider wall wherein said internal exhaust conduit opens on a lateral surface of at least one of said divider walls.

2. The device according to claim 1, wherein said chuck is mounted on a rotary shaft and comprises a series of upwardly projecting pins configured to confine a wafer-shaped article on said chuck.

3. The device according to claim 2, wherein surfaces of said pins configured to contact a wafer shaped article are spaced above said plurality of nested partitions when each of said plurality of nested partitions is in a vertically lowermost position, thereby to permit loading and unloading of a wafer shaped article onto and from said chuck.

4. The device according to claim 3, wherein said chuck is fixedly mounted relative to said collector against movement along an axis of rotation of said chuck.

5. The device according to claim 1, wherein said chuck is a magnetic rotor positioned within a housing and surrounded by a magnetic stator positioned outside said housing, said magnetic rotor comprising a series of downwardly projecting pins configured to confine a wafer-shaped article on said chuck.

6. The device according to claim 1, wherein said plurality of nested partitions is a plurality of annular concentric partitions.

7. The device according to claim 1, wherein each of said plurality of nested partitions comprises a base portion including an inner flange disposed adjacent a radially inner side of a corresponding one of said plurality of divider walls, and an outer flange disposed adjacent a radially outer side of said corresponding one of said plurality of divider walls.

8. The device according to claim 1, wherein said internal exhaust conduit opens on a radially inwardly facing surface of said at least one of said divider walls.

9. The device according to claim 1, wherein said internal exhaust conduit opens on a radially outwardly facing surface of said at least one of said divider walls.

10. The device according to claim 1, wherein said internal exhaust conduit is covered by one of said plurality of divider walls in a vertically lowermost position of said one of said plurality of divider walls, and uncovered by said one of said plurality of divider walls in a vertically uppermost position of said one of said plurality of divider walls.

11. The device according to claim 1, wherein said internal exhaust conduit is exposed through a window formed in one of said plurality of divider walls in a vertically lowermost position of said one of said plurality of divider walls, and covered by said one of said plurality of divider walls in a vertically uppermost position of said one of said plurality of divider walls.

12. The device according to claim 1, wherein said liquid drainage channels and said liquid drainage conduits are fixedly mounted relative to said collector.

13. The device according to claim 1, said plurality of divider walls comprises at least three divider walls, and wherein said plurality of nested partitions comprises at least three divider walls each positioned on a corresponding one of said at least three divider walls, and wherein at least two of said at least three divider walls comprises an internal exhaust conduit communicating with a corresponding exhaust duct underlying a corresponding one of said at least three divider walls.

14. A method for processing wafer-shaped articles, comprising:
- positioning a wafer shaped article on a chuck;
- changing a vertical position of at least one of a plurality of nested partitions surrounding said chuck, each of the plurality of nested partitions being positioned on a corresponding one of a plurality of divider walls formed in a base of a collector that surrounds the chuck;
- rotating the chuck and the wafer shaped article; and
- venting exhaust gases from the collector through an internal exhaust conduit formed to open on a lateral surface of at least one of the plurality of divider walls, and into an exhaust duct underlying the at least one divider wall.

* * * * *